United States Patent
Hollenbeck et al.

(10) Patent No.: US 6,380,487 B1
(45) Date of Patent: Apr. 30, 2002

(54) CIRCUIT BOARD PROTECTION SYSTEM AND METHOD

(75) Inventors: Robert Keith Hollenbeck, Fort Wayne; James Kiefer, Columbia City, both of IN (US)

(73) Assignee: General Electric Company, Schenectady, NY (US)

( * ) Notice: Subject to any disclaimer, the term of this patent is extended or adjusted under 35 U.S.C. 154(b) by 15 days.

(21) Appl. No.: 09/625,394

(22) Filed: Jul. 26, 2000

(51) Int. Cl.[7] .............................................. H01B 7/28
(52) U.S. Cl. ................... 174/135; 174/35 R; 29/623.2; 361/748
(58) Field of Search ............................. 174/35 R, 135, 174/136; 361/748; 29/623.2

(56) References Cited

U.S. PATENT DOCUMENTS

| | | | |
|---|---|---|---|
| 4,988,577 A | * | 1/1991 | Jamieson ..................... 428/573 |
| 5,293,004 A | * | 3/1994 | Kawakami et al. .......... 174/250 |
| 5,375,040 A | * | 12/1994 | Cooper et al. ............... 361/730 |
| 5,994,643 A | * | 11/1999 | Saito .......................... 174/35 R |
| 6,145,280 A | * | 11/2000 | Daroux et al. ................. 53/433 |
| 6,201,192 B1 | * | 3/2001 | Wille et al. .................. 174/255 |
| 6,223,429 B1 | * | 5/2001 | Kaneda et al. ................ 29/832 |
| 6,239,980 B1 | * | 5/2001 | Fillion et al. ................ 361/760 |
| 6,292,370 B1 | * | 9/2001 | Anderson et al. ........... 361/748 |

* cited by examiner

Primary Examiner—Dean A. Reichard
Assistant Examiner—Adolfo Nino
(74) Attorney, Agent, or Firm—Karl Vick, Esq.; Damian Wasserbauer, Esq.; Armstrong Teasdale LLP

(57) ABSTRACT

A circuit board protection system includes a circuit board including at least one edge, an enclosure used to encapsulate the edge, and a seal. The seal encapsulates the edge and prevents liquid from contacting the edge. Accordingly, the circuit board is protected from liquid infiltration at the edge of the board. Additionally, a method for protecting a circuit board, including at least one edge, in a board enclosure includes applying encapsulating material to at least one of the board enclosure and the edge, and positioning the circuit board in the enclosure such that the edge is encapsulated.

20 Claims, 1 Drawing Sheet

CIRCUIT BOARD PROTECTION SYSTEM AND METHOD

BACKGROUND OF THE INVENTION

This invention relates generally to electronic equipment and, more particularly, to circuit boards.

Circuit boards are susceptible to damage from environmental hazards. Specifically, water and chemicals can damage a circuit board and components on the circuit board. To protect the components, a conformal coating is sometimes applied. Typically, conformal coatings are formulated from polymeric materials of acrylic, epoxy, silicone, and urethane families, and protect the components from moisture. Additionally, conformal coatings tend to restrain components from vibrating. Component vibration is common in motor control circuit board applications. The thickness of conformal coatings varies in relation to the thickness of the corresponding circuit board components. A circuit board with only thin components usually has a thinner coating than a circuit board with thick components. However, the edges of a circuit board typically have a thin coating regardless of component thickness.

A circuit board's thin edge coating sometimes wears or degrades from general handling such as removing a board from a panel. Additionally, vibration of the board may degrade the conformal coating if the board contacts a board support structure. Typically, the board contacts the board support structure at an edge of the board thus leading to degradation of the thin edge coating. The resulting degradation of the thin edge coating exposes an edge of a board to the environment. Accordingly, when a liquid contacts an exposed edge the liquid may infiltrate the board often leading to board and/or circuit damage. Additionally, most circuit boards are laminated and liquid exposure commonly causes a delamination of layers of a board.

BRIEF SUMMARY OF THE INVENTION

In an exemplary embodiment, a circuit board protection system provides additional protection to a circuit board by preventing liquid from infiltrating the board. The circuit board protection system includes a circuit board including at least one edge, an enclosure configured to facilitate encapsulating the edge, and a seal. The seal encapsulates the edge and prevents liquid from contacting the edge during an exposure to environmental hazards. Accordingly, the circuit board is protected from liquid infiltration at the edge of the board.

DETAILED DESCRIPTION OF THE INVENTION

Figure 1:
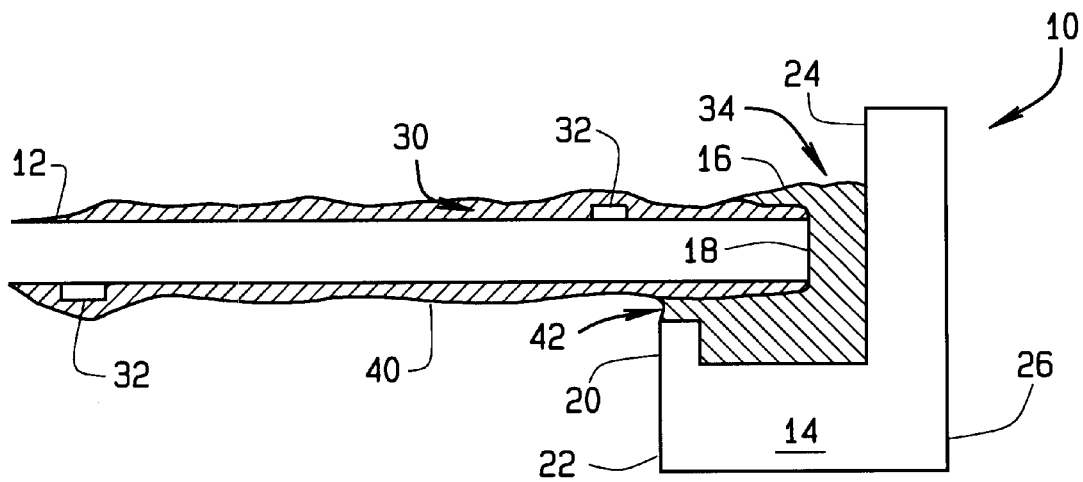
FIG. 1 is a schematic side view of a circuit board protection system.
Figure 2:
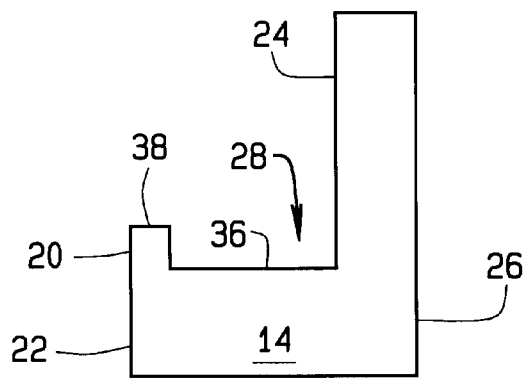
FIG. 2 is a schematic side view of the enclosure shown in FIG. 1.

FIG. 1 is a side view of a circuit board protection system 10 including a circuit board 12, an enclosure 14, and a seal 16. FIG. 2 is a schematic side view of enclosure 14 shown in FIG. 1. Circuit board 12 includes an edge 18, and enclosure 14 includes a dam 20, a first inner side 22, a second inner side 24, and an outer side 26. In an exemplary embodiment, encapsulating material, in an amorphous state, is positioned in a cavity 28 and circuit board 12 is positioned such that edge 18 is encapsulated in the encapsulating material. Dam 20 reduces or inhibits the amorphous encapsulating material from running down first inner side 22. After sufficient time has elapsed, the initially amorphous encapsulating material cures and hardens forming seal 16. In one embodiment, the encapsulating material is provided in a caulk tube (not shown) and is applied with a caulk gun (not shown). In another embodiment, the encapsulating material is provided in a 55-gallon drum (not shown) and is applied with a delivery gun (not shown) utilizing compressed air. In a further embodiment, the encapsulating material is applied automatically utilizing a robotic arm and a pump to deliver the encapsulating material to the arm.

Additionally, circuit board 12 includes a conformal coating 30 and a plurality of components 32. Conformal coating 30 is applied by the manufacturer of circuit board 12 and is intended to protect the components 32 and a circuit (not shown) printed on board 12. In one embodiment, circuit board 12 is a printed wiring board such as, but not limited to, a polyimide, MYLAR, polymer-glass, or phenolic film. In another embodiment, circuit board 12 is a ceramic circuit board, also called a multilayer interconnect board. It is contemplated that the benefits of a circuit board protection system 10 accrue to all types of circuit boards 12 including, but not limited to, flex boards. Typically, components 32 are electrically and physically connected to circuit board 12.

In an exemplary embodiment, encapsulating material is applied directly to edge 18. It is contemplated that a wide variety of materials may be used as an encapsulating material. For example, all materials suitable for fabricating conformal coating 30 are suitable for fabricating seal 16. Suitable materials include, but are not limited to, polymeric materials including materials from acrylic, epoxy, silicone, and urethane families. In an alternative embodiment, enough encapsulating material is used such that when circuit board 12 is positioned, seal 16 completely fills a gap 34 between edge 18 and second inner wall 24. Accordingly, a liquid will run off and not collect or pool near edge 18.

Enclosure 14 further includes a first top side 36 and a second top side 38. Second inner side 24, first top side 36, and dam 20 form cavity 28. In a further embodiment not including dam 20, cavity 28 is formed by second inner side 24 and first top side 36. In a further exemplary embodiment not including dam 20, the encapsulating material is gelated such that the material does not run down first inner side 22.

Circuit board 12 further includes a bottom side 40, and a gap 42 is between bottom side 40 and second top side 38. In one embodiment, enough encapsulating material is applied such that when circuit board 12 is positioned within enclosure 14, seal 16 fills at least a portion of gap 42. In alternative embodiment, gap 42 contains no encapsulating material.

In a further exemplary embodiment, the encapsulating material comprises a resilient material and encapsulates a circuit board 12 for a motor controller for an electronically commutated motor (not shown). During operation of the motor, circuit board protection system 10 protects board 12 from environmental hazards and, moreover, protects board 12 from vibrations because of the resiliency of the encapsulating material. Electronically commutated motors sometimes vibrate which can lead to component 32 failure. Accordingly, utilizing a resilient encapsulating material in circuit board protection system 10 protects circuit board 12 from environmental hazards in an electrically commutated motor and provides damping of vibration of circuit board 12 and its components 32.

While the invention has been described in terms of various specific embodiments, those skilled in the art will recognize that the invention can be practiced with modification within the spirit and scope of the claims.

What is claimed is:

1. A circuit board protection system comprising:
   a circuit board comprising at least one edge;
   a board enclosure configured to facilitate encapsulating said edge; and
   a seal comprising encapsulating material encapsulating said edge.

2. A circuit board protection system in accordance with claim 1 wherein said enclosure board comprises a dam.

3. A circuit board protection system in accordance with claim 1 wherein said encapsulating material comprises a polymeric material.

4. A circuit board protection system in accordance with claim 3 wherein said polymeric material comprises at least one of acrylic, epoxy, silicone, and urethane.

5. A circuit board protection system in accordance with claim 1 wherein said board enclosure comprises a first inner wall and a second inner wall, said seal further configured to at least partially fill a cavity between said edge and said second inner wall.

6. A circuit board protection system in accordance with claim 5 wherein said board enclosure further comprises a dam.

7. A circuit board protection system in accordance with claim 6 wherein said board enclosure further comprises a top side, said circuit board comprises a bottom side, said seal further configured to fill at least a portion of a gap between said bottom side and said top side.

8. A method for protecting a circuit board in a board enclosure, said method comprising the steps of:
   applying encapsulating material to at least one of the board enclosure and an edge of the circuit board; and
   positioning the circuit board in the enclosure such that the edge is encapsulated.

9. A method in accordance with claim 8 wherein said board enclosure includes an inner wall, said step of positioning the circuit board further comprises the step of positioning the circuit board such that the encapsulating material fills a gap between the edge and the inner wall.

10. A method in accordance with claim 8 wherein said step of applying further comprises the step of applying encapsulating material to at least one of a board enclosure comprising a dam and an edge of the circuit board.

11. A method in accordance with claim 10 wherein said step of applying further comprises the step of applying a polymeric material.

12. A method in accordance with claim 11 wherein said step of applying further comprises the step of applying at least one of acrylic, epoxy, silicone, and urethane.

13. A method in accordance with claim 10 wherein said board enclosure includes an inner wall, said step of applying further comprises the step of applying encapsulating material such that a cavity between the edge and the inner wall is at least partially filled with the encapsulating material.

14. A method in accordance with claim 13 wherein said board enclosure includes a top side, said circuit board includes a bottom side, said step of applying further comprises the step of applying encapsulating material such that a gap between the bottom side and the top side is at least partially filled with the encapsulating material.

15. A circuit board protection system for an electrically commutated motor, said system comprising:
   a circuit board comprising at least one edge, said circuit board configured to control said motor;
   a board enclosure configured to facilitate encapsulating said edge; and
   a seal comprising encapsulating material configured to encapsulate said edge.

16. A circuit board protection system in accordance with claim 15 wherein said board enclosure comprises a dam.

17. A circuit board protection system in accordance with claim 15 wherein said encapsulating material comprises a polymeric material.

18. A circuit board protection system in accordance with claim 17 wherein said polymeric material comprises at least one of acrylic, epoxy, silicone, and urethane.

19. A circuit board protection system in accordance with claim 15 wherein said board enclosure comprises a first inner wall and a second inner wall, said seal further configured to at least partially fill a cavity between said edge and said second inner wall.

20. A circuit board protection system in accordance with claim 19 wherein said board enclosure further comprises a dam.

* * * * *

UNITED STATES PATENT AND TRADEMARK OFFICE
CERTIFICATE OF CORRECTION

PATENT NO. : 6,380,487 B1
DATED : April 30, 2002
INVENTOR(S) : Hollenbeck et al.

It is certified that error appears in the above-identified patent and that said Letters Patent is hereby corrected as shown below:

<u>Column 3,</u>
Line 12, delete "enclosure board" and substitute -- board enclosure --.

Signed and Sealed this

Fifteenth Day of October, 2002

*Attest:*

*Attesting Officer*

JAMES E. ROGAN
*Director of the United States Patent and Trademark Office*